US011255898B2

(12) United States Patent
Winkler et al.

(10) Patent No.: US 11,255,898 B2
(45) Date of Patent: Feb. 22, 2022

(54) SYSTEM AND METHOD FOR TESTING A DEVICE-UNDER-TEST

(71) Applicant: Rohde & Schwarz GmbH & Co. KG, Munich (DE)

(72) Inventors: Thomas Winkler, Berlin (DE); Thomas Ruster, Munich (DE); Ryanne Leong, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 32 days.

(21) Appl. No.: 16/870,374

(22) Filed: May 8, 2020

(65) Prior Publication Data

US 2021/0349142 A1 Nov. 11, 2021

(51) Int. Cl.
*G01R 31/28* (2006.01)
*G01R 1/07* (2006.01)

(52) U.S. Cl.
CPC .......... *G01R 31/281* (2013.01); *G01R 1/071* (2013.01); *G01R 31/2806* (2013.01)

(58) Field of Classification Search
CPC .............. G01R 15/241; G01R 31/2653; G01R 31/2656; G01R 33/0385; G01R 33/26;
(Continued)

(56) References Cited

U.S. PATENT DOCUMENTS 4,700,225 A * 10/1987 Hara .................. G01R 31/2806
382/149
6,633,376 B1 * 10/2003 Nishida ................ G01N 21/956
356/237.5

(Continued)

FOREIGN PATENT DOCUMENTS

EP 3213093 A1 9/2017
FR 3027681 A1 4/2016
(Continued)

OTHER PUBLICATIONS

Simons et al., "A Rydberg atom-based mixer: Measuring the phase of a radio frequency wave", Mar. 9, 2019.

*Primary Examiner* — Vinh P Nguyen
(74) *Attorney, Agent, or Firm* — Ditthavong, Steiner & Mlotkowski

(57) ABSTRACT

The invention relates to a system in particular a quantum sensor system, for testing a device-under-test, DUT, comprising: an optically excitable medium which is arranged to receive electromagnetic, EM, radiation emitted by the DUT, at least one light source configured to irradiate the medium with at least one light beam, wherein the medium is optically excited by the at least one light beam, a field generator unit configured to generate an electric and/or magnetic field within the medium, wherein a resonance frequency of the excited medium is modified by an amplitude of the electric and/or magnetic field, wherein an optical parameter, in particular a luminescence, of the exited medium is locally modified if a frequency of the EM radiation corresponds to the resonance frequency at a position in the medium, an image detector configured to acquire an image of the medium, wherein the image shows an intensity profile that results from the modification of the optical parameter, a processor configured to analyze the DUT based on the acquired image.

16 Claims, 7 Drawing Sheets

(58) Field of Classification Search
CPC .. G01R 33/60; G01R 33/323; G01R 1/06772; G01R 1/071; G01R 13/347; G01R 15/242; G01R 23/02; G01R 31/00; G01R 31/309; G01R 31/2884; G01R 31/002; G01R 33/1269; G01R 31/311; G01R 29/10; G01R 31/2806; G01R 31/281; G01N 2015/0038; G01N 15/1434; G01N 15/0612; G01N 21/88; G02B 27/0101; G02B 6/0028; G02B 6/005; G02B 6/0068; G02B 6/0088; G02F 1/133616; G02F 1/035; G02F 1/0356; G02F 1/065; G02F 1/076; G06T 7/0004; G06T 1/0014; G06T 2207/10152; G06T 7/586

See application file for complete search history.

(56) References Cited

U.S. PATENT DOCUMENTS

| | | | |
|---|---|---|---|
| 6,700,658 B2 * | 3/2004 | Leonard | G01N 21/95684 |
| | | | 356/237.1 |
| 10,126,377 B2 * | 11/2018 | Hahn | G01N 21/64 |
| 10,228,429 B2 * | 3/2019 | Bruce | G01R 33/032 |

FOREIGN PATENT DOCUMENTS

| | | |
|---|---|---|
| WO | 2016066532 A1 | 5/2016 |
| WO | 2019158646 A1 | 8/2019 |

\* cited by examiner

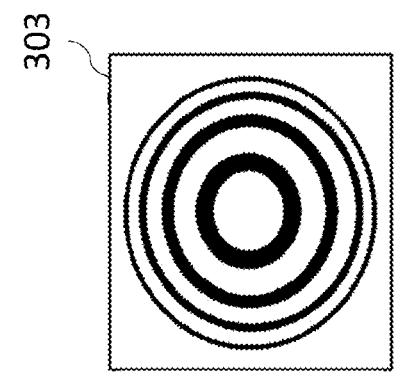
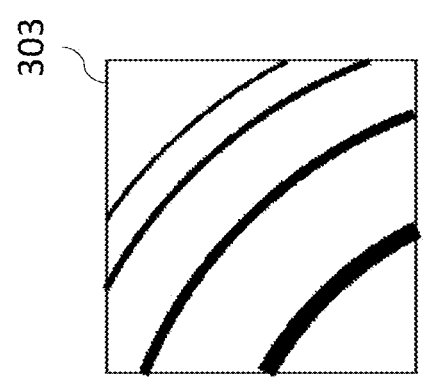
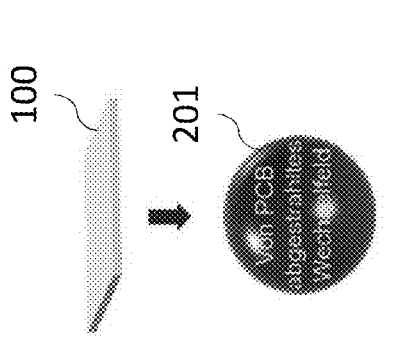
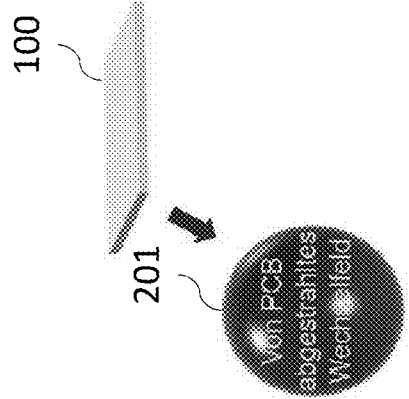
Fig. 5a
Fig. 5b

SYSTEM AND METHOD FOR TESTING A DEVICE-UNDER-TEST

TECHNICAL FIELD OF THE INVENTION

The invention relates to a system, in particular a quantum sensor system, and a method for testing a device-under-test.

BACKGROUND OF THE INVENTION

Many electronic devices undergo testing at first manufacture or later during their life cycles. During testing, such devices are typically referred to as device-under-test (DUT).

For example, printed circuit boards (PCBs) are usually tested at some point during a production process to identify and remove PCBs which have a defect. Ideally, this testing is carried out as quickly as possible, for instance while the PCBs are on an assembly line, to avoid delaying the production process.

In a typical testing scheme, the device is connected to a test rig via a wire in order to test various device functionalities. However, this way of testing can be slow, because each PCB must be connected and disconnected from the test rig, and requires additional equipment.

PCBs are often designed to emit electromagnetic radiation, e.g. for communication, sensing or radar applications. During the testing of these devices, it should be analyzed, whether this radiation is emitted in the correct way, e.g. at a correct frequency or from a correct location on the device.

There are many measurement schemes to analyze electromagnetic radiation. For example, Simons, et al. "A Rydberg atom-based mixer: Measuring the phase of a radio frequency wave." Applied Physics Letters 114.11 (2019), 114101 discloses a device for analyzing a signal by means of a material with optical properties that can be modified by an optical excitation.

Thus, it is an objective to provide an improved system and an improved method for testing a DUT, which avoid the above-mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the present disclosure relates to a system, in particular a quantum sensor system, for testing a device-under-test (DUT), comprising: an optically excitable medium which is arranged to receive electromagnetic (EM) radiation emitted by the DUT, at least one light source configured to irradiate the medium with at least one light beam, wherein the medium is optically excited by the at least one light beam, a field generator unit configured to generate an electric and/or magnetic field within the medium, wherein a resonance frequency of the excited medium is modified by an amplitude of the electric and/or magnetic field, wherein an optical parameter, in particular a luminescence, of the exited medium is locally modified if a frequency of the EM radiation corresponds to the resonance frequency at a position in the medium, an image detector configured to acquire an image of the medium, wherein the image shows an intensity profile that results from the modification of the optical parameter, and a processor configured to analyze the DUT based on the acquired image.

This achieves the advantage that the DUT can be evaluated efficiently and in a contactless manner.

Preferably, the DUT comprises at least one emitter for emitting the EM radiation, for instance a transmitting antenna on a certain location on the DUT. For example, the DUT is a printed circuit board (PCB) which is tested by the system during an automated rapid assembly line screening.

The EM radiation emitted by the DUT can be a microwave radiation. For example, the EM radiation has a frequency of 50 MHz.

The electric and/or magnetic field can comprise a static or a continuous filed, in particular a field with a static or a continuous amplitude within the medium. If the field is static within the medium, than the resonance frequency of the medium is equal everywhere in the medium; and if the field is continuous within the medium, than the resonance frequency of the medium is also continuous within the medium.

The optically excitable medium can comprise atoms that are excited by the at least one light beam and preferably by the electric and/or magnetic field to form Rydberg atoms. In particular, the optical excitation comprises an electromagnetically induced transparency (EIT).

The at least one light source can be configured to generate the at least one light beam with an adjustable wavelength and/or adjustable intensity. Preferably, the at least one light source is configured to switch the light beam on and off. In particular, the at least one light beam is generated at a wavelength that corresponds to or is close to a resonant transition of the medium.

The image detector can be a camera. The image detector can be configured to receive the at least one light beam after passing the medium to acquire the image of the medium.

The processor can be integrated in a data-processing device, e.g. a computer, that is connected to the image detector.

In an embodiment, the processor is configured to extract and/or reconstruct a phase information of the EM radiation from the intensity profile.

This achieves the advantage the phase of the EM radiation can be evaluated efficiently by the system. For example, the DUT is designed for radar applications and the evaluation of the phase is part of a function test of the DUT.

In an embodiment, the system further comprises an emitter unit, in particular a local oscillator, wherein the emitter unit is configured to emit an EM signal towards the medium, wherein the EM radiation emitted by the DUT is superimposed by the EM signal within the medium, and wherein the processor is configured to extract and/or reconstruct the phase information of the EM radiation from a change in the intensity profile resulting from the superposition of the EM radiation and the EM signal within the medium.

This achieves the advantage the phase of the EM radiation can be evaluated efficiently by the system.

The EM signal generated by the local oscillator can be a radio frequency (RF) signal. Preferably, the frequency of the EM signal generated by the local oscillator deviates by less than 1%, in particular less than 0.1%, more particular less than 0.01%, from the frequency of the EM radiation emitted by the DUT. Preferably, the EM signal is a reference signal with a predefined frequency that mixes with the EM radiation inside the medium.

The emitter unit can comprise an antenna, for instance a horn antenna, for emitting the EM signal with a predefined and preferably adaptable frequency. Either the emitter unit, in particular the antenna of the emitter unit, or the DUT can be locally displaced while emitting the EM signal or EM radiation, respectively, resulting in a shift of a relative phase between the EM signal and the EM radiation within the medium. This shift of the relative phase between EM signal and EM radiation causes an observable change in the intensity profile. The processor can be configured to extract and/or reconstruct the phase information of the EM radiation based on said change. Preferably, the processor is configured to determine the phase of the EM radiation based on the observed change of the relative phase. In particular, to determine the phase of the EM radiation, the processor takes into account further parameters, such as the displacement of the emitter unit, the emission angle of the EM signal, the intensity of the EM signal, and/or a propagation constant of the medium.

In an embodiment, the amplitude of the electric and/or magnetic field varies at different positions in the excited medium, resulting in different resonance frequencies at said positions, wherein the processor is configured to determine the frequency of the EM radiation based on a location and/or a shape of features in the intensity profile.

This achieves the advantage the system can analyze at which frequency the EM radiation is emitted by the DUT. In this way, faulty DUTs that emit the EM radiation at a wrong frequency can be detected.

In an embodiment, the amplitude of the electric and/or magnetic field is homogeneous in the excited medium, resulting in an equal resonance frequency everywhere in the medium, wherein the processor is configured to determine a location of a source of the EM radiation on the DUT based on a location and/or a shape of features in the intensity profile.

This achieves the advantage the system can analyze from which location on the DUT the EM radiation is emitted. In this way, faulty DUTs that emit the EM radiation from a wrong location, e.g. from a wrong emitter, can be detected.

In an embodiment, the system comprises two light sources configured to irradiate the medium with two light beams, wherein of each of the two light beams has a frequency that corresponds to a different resonance frequency of the medium.

This achieves the advantage that the medium can be excited efficiently, in particular to a Rydberg state and/or to an electromagnetically induced transparency.

Each of the two light sources can irradiate the medium with light at a different wavelength, wherein each wavelength is tuned to excite a different state of the medium. For example, one light source is a probe laser and the other light source is a coupling laser. In particular, at least one of the two light sources can be configured to emit green laser light.

The image detector can be configured to receive light from at least one of the two light sources, in particular green laser light, to acquire the image of the medium.

In an embodiment, the field generator unit comprises a capacitor.

This achieves the advantage that the electric field with constant amplitude can be generated efficiently within the medium.

Preferably, the filed generator comprises a magnetic field source for generating the magnetic field.

In an embodiment, the optically excitable medium is a gas, in particular a caesium gas, wherein the gas is stored in a gas cell.

In another embodiment, the optically excitable medium is a solid material, in particular diamond.

In an embodiment, the DUT is a printed circuit board (PCB).

All the above-mentioned embodiments and/or optional features of the system for testing the DUT can be combined.

According to a second aspect, the present disclosure relates to a method for testing a DUT, comprising the steps:

receiving an EM radiation emitted by the DUT at an optically excitable medium, irradiating the medium with at least one light beam; wherein the medium is optically excited by the at least one light beam, generating an electric and/or magnetic field within the medium, wherein a resonance frequency of the excited medium is modified by an amplitude of the electric and/or magnetic field, wherein an optical parameter, in particular a luminescence, of the exited medium is locally modified if a frequency of the EM radiation corresponds to the resonance frequency at a position in the medium, acquiring an image of the medium, wherein the image shows an intensity profile that results from the modification of the optical parameter, and analyzing the DUT based on the acquired image.

This achieves the advantage that the DUT can be evaluated efficiently and in a contactless manner.

In an embodiment, the step of analyzing the DUT comprises:

extracting and/or reconstructing a phase information of the EM radiation from the intensity profile.

This achieves the advantage the phase of the EM radiation can be evaluated efficiently by the system.

In an embodiment, the method further comprises the step of:

emitting an EM signal towards the medium, wherein the EM radiation emitted by the DUT is superimposed by the EM signal within the medium; and wherein the phase information of the EM radiation is extracted and/or reconstructed from a change in the intensity profile resulting from the superposition of the EM radiation and the EM signal within the medium.

This achieves the advantage the phase of the EM radiation can be evaluated efficiently by the system, in particular based on a shift of a relative phase between the EM radiation and the EM signal.

In an embodiment, the amplitude of the electric and/or magnetic field varies at different positions in the excited medium, resulting in a variation of the resonance frequency at said positions, wherein the step of analyzing the DUT comprises:

determining the frequency of the EM radiation based on a location and/or a shape of features in the intensity profile.

This achieves the advantage the system can analyze at which frequency the EM radiation is emitted by the DUT. In this way, faulty DUTs that emit the EM radiation at a wrong frequency can be detected.

In an embodiment, the amplitude of the electric and/or magnetic field is homogeneous in the excited medium, resulting in an equal resonance frequency everywhere in the medium, wherein the step of analyzing the DUT comprises:

determining a location of a source of the EM radiation on the DUT based on a location and/or a shape of features in the intensity profile.

This achieves the advantage the system can analyze from which location on the DUT the EM radiation is emitted. In this way, faulty DUTs that emit the EM radiation from a wrong location, e.g. from the wrong emitter, can be detected.

In an embodiment, the medium is irradiated with two light beams, wherein of each of the two light beams has a frequency that corresponds to a different resonance frequency of the medium.

This achieves the advantage that the medium can be excited efficiently, in particular to a Rydberg state and/or to an electromagnetically induced transparency.

All the above-mentioned embodiments and/or optional features of the method for testing the DUT can be combined.

The above description with regard to the system for testing the DUT according to the first aspect of the present disclosure is correspondingly valid for the method for testing the DUT according to the second aspect of the present disclosure.

BRIEF DESCRIPTION OF THE DRAWINGS

The invention will be explained in the followings together with the figures.

FIG. 5a-b show schematic diagrams of measurement schemes for localizing an EM radiation source on a DUT according to embodiments;

DETAILED DESCRIPTION OF THE PREFERRED EMBODIMENTS

Figure 1:
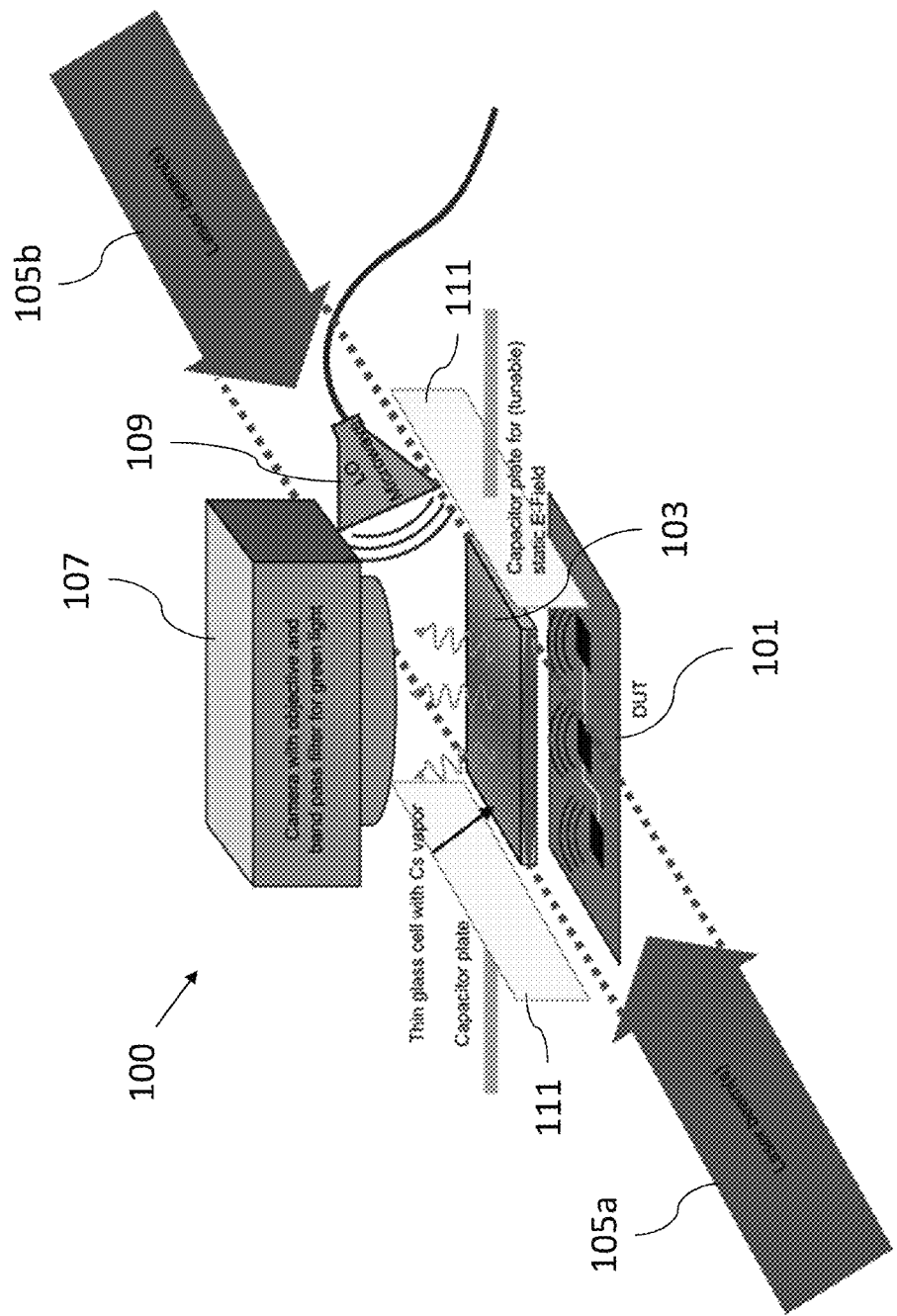
FIG. 1 shows a schematic diagram of a system for testing a DUT according to an embodiment.

FIG. 1 shows a schematic diagram of a system 100 for testing a DUT 101 according to an embodiment.

The system 100 comprises an optically excitable medium 103 which is arranged to receive EM radiation emitted by the DUT 101, at least one light source configured to irradiate the medium with at least one light beam 105a, 105b, wherein the medium 103 is optically excited by the at least one light beam 105a, 105b, and a field generator unit configured to generate an electric and/or magnetic field within the medium, wherein a resonance frequency of the excited medium 103 is modified by an amplitude of the electric and/or magnetic field, and wherein an optical parameter, in particular a luminescence, of the exited medium 103 is locally modified if a frequency of the EM radiation corresponds to the resonance frequency at a position in the medium 103. The system 100 further comprises an image detector 107 configured to acquire an image of the medium 103, wherein the image shows an intensity profile that results from the modification of the optical parameter, and a processor configured to analyze the DUT 101 based on the acquired image.

The DUT 101 can comprises at least one emitter for the EM radiation. The EM radiation can be a microwave radiation with a frequency of, for instance, 50 MHz. For example, the DUT 101 is a PCB, which is tested by the system 100.

The optically excitable medium 103 can be gaseous, e.g. a caesium vapor, and can be arranged in a glass cell. Alternatively, the optically excitable medium 103 can be a solid material, such as diamond. The optical excitation can be a Rydberg state or an electromagnetically induced transparency (EIT) of the medium 103.

Preferably, the system 100 comprises two light sources, in particular lasers that generate two light beams 105a, 105b to optically excite the medium. Each light beam 105a, 105b can have a different wavelength, wherein each wavelength is tuned to excite a different state of the medium. At least one of the light beams 105a, 105b can be a green laser light.

If the medium 103 is a caesium gas, the first light source can be configured to illuminate the caesium gas with light at a wavelength of ca. 852 nm, and the second light source light source can be configured to illuminate the caesium gas with light at a wavelength of ca. 509-517 nm.

The image detector 107 can be a camera. The image detector 107 can comprise an objective and a band pass filter for the wavelength of at least one of the light beams 105a, 105b, in particular for green light.

The field generator unit can comprise a capacitor 111. The capacitor 111 can be configured to generate a static, in particular non-oscillating, electric field in the medium 103, wherein an amplitude of the electric field is tunable. The capacitor 111 may comprise capacitor plates on two opposite sides of the medium 103. In an embodiment, the field generator further comprises a magnetic field source (not shown) for generating a static magnetic field in the medium 103.

The field generator unit can further be configured to generate a continuous electric and/or magnetic field, i.e. a field with gradually changing amplitude, in the medium 103.

The system 100 can further comprise an emitter unit 109 to generate an EM signal. The emitter unit 109 can be a local oscillator. The EM signal can be a microwave signal with a similar frequency as the EM signal generated by the DUT. Preferably, the EM radiation emitted by the DUT 101 mixes with the EM radiation generated by the emitter unit 109 within the medium. The phase of the EM radiation can be determined based on this superposition of the EM radiation and the EM signal. Preferably, the optically excitable medium 103, the field generator unit and the image detector 107 form a quantum sensor.

Figure 2:
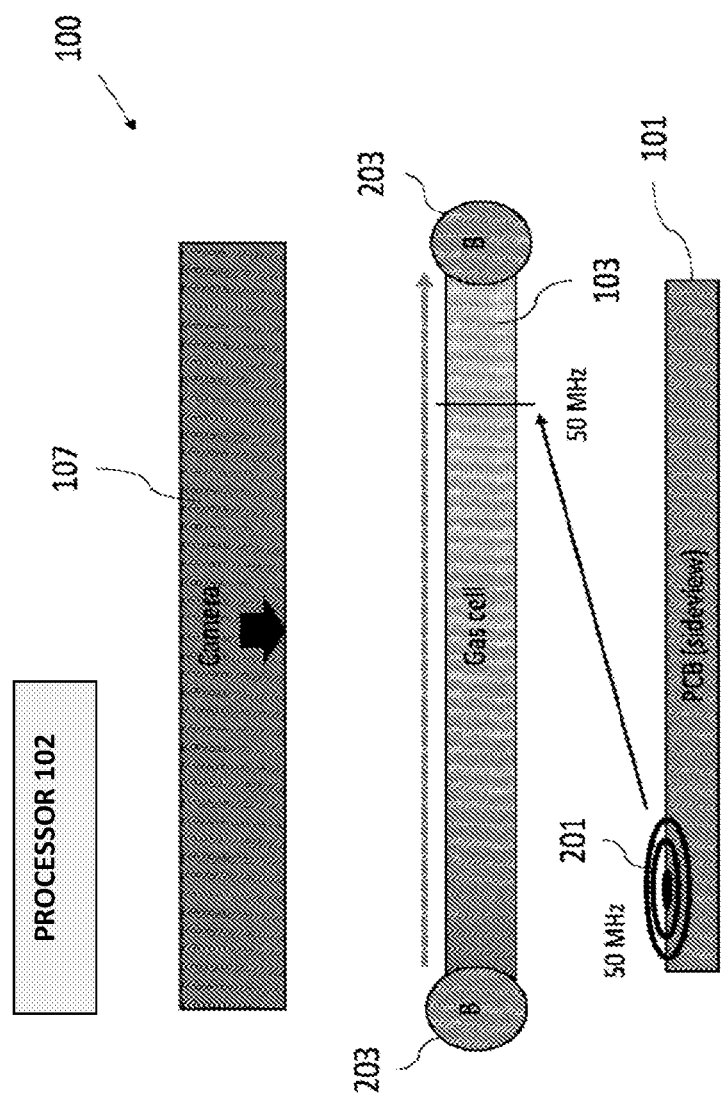
FIG. 2 shows a schematic diagram of a system for testing a DUT according to an embodiment.

FIG. 2 shows a schematic diagram of the system 100 for testing the DUT 101 according to an embodiment.

In the system 100 shown in FIG. 2, the field generator unit generates a magnetic field 203 with a continuously changing amplitude, resulting in a continuously changing resonance frequency in the medium 103. In other words, the resonance frequency varies and has a continuous distribution in the excited medium 103.

The DUT 101 emits the EM radiation 201 from a certain location, e.g. an antenna on the DUT 101. For example, the EM radiation 201 has a frequency of 50 MHz. At a certain location in the medium 103, the resonance frequency of the medium 103 can match the frequency of the EM radiation. At said location the EM radiation 201 modifies the optical parameter, in particular the luminesce, of the medium 103, which can be detected by the image detector 107. In particular, the processor is configured to analyze the acquired image and to determine the frequency of the EM radiation based on the location and/or a shape of features in the intensity profile depicted in the image. The processor 102 is illustrated in FIG. 2.

In particular, the system 100 shown in FIG. 2 is a quantum spectrum analyzer system, which measures in a frequency domain.

Figure 3:
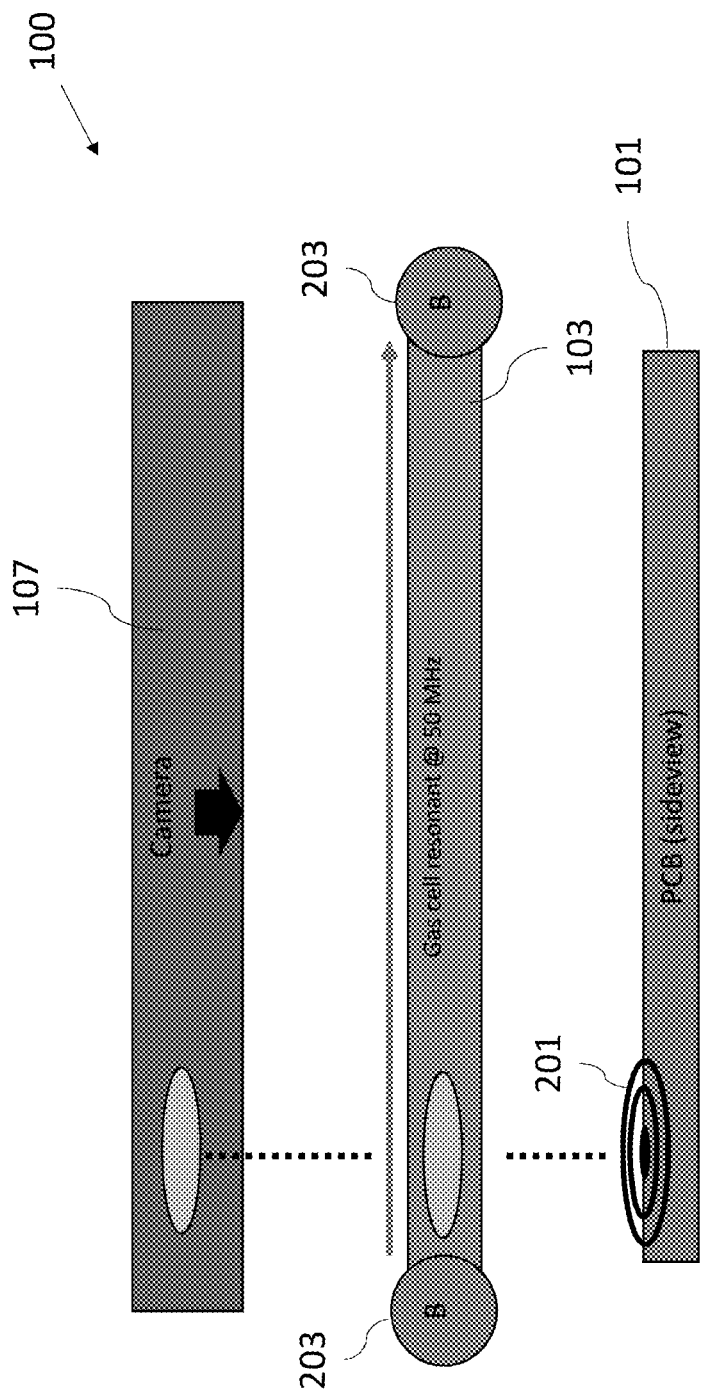
FIG. 3 shows a schematic diagram of a system for testing a DUT according to an embodiment.

FIG. 3 shows a schematic diagram of the system 100 for testing the DUT 101 according to another embodiment.

In the system 100 shown in FIG. 3, the field generator unit generates a constant magnetic field 203 resulting in a constant resonance frequency everywhere in the excited medium 103.

The constant magnetic field 203 can be configured to set the resonance frequency of the medium 103 to the frequency of the EM radiation 201 which was preferably detected in an earlier step using a continuous magnetic field 203, as shown in FIG. 2. In particular, the magnetic field 203 is adjusted to apply a 5 MHz filter.

Preferably, the EM radiation 201 modifies the optical parameter, in particular the luminescence, of the medium 103, wherein a location and shape of the modification depends on the spatial coordinates on the DUT 201 from which the EM radiation 201 is emitted. In particular, the processor is configured to determine the location of a source of the EM radiation 201 on the DUT 101 based on a location and/or a shape of features in the intensity profile.

Figure 4:
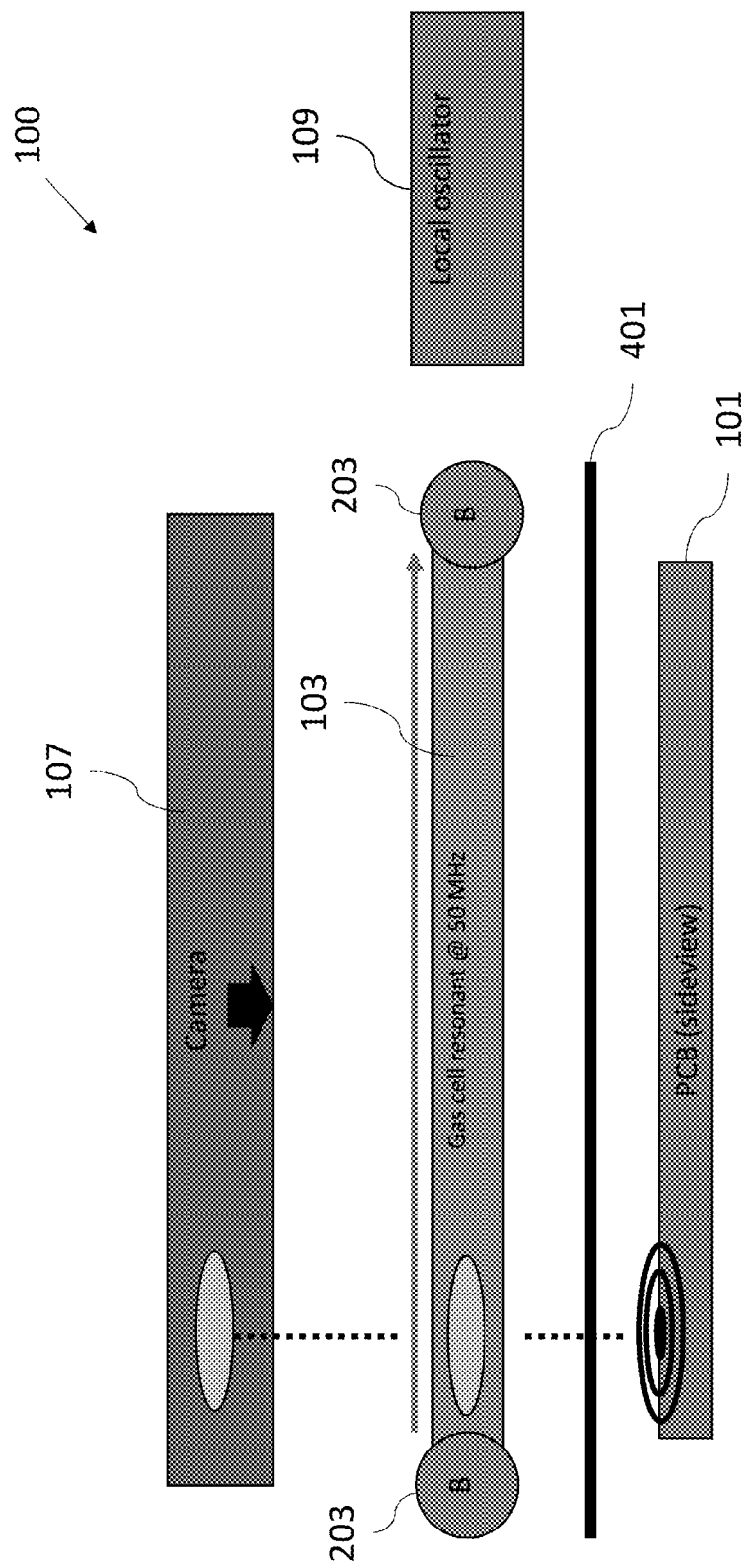
FIG. 4 shows a schematic diagram of a system for testing a DUT according to an embodiment.

FIG. 4 shows a schematic diagram of the system 100 for testing the DUT 101 according to another embodiment.

The system 100 in FIG. 4 comprises the local oscillator 109, which generates an EM signal with a frequency that is similar to the frequency of the EM radiation. Preferably, the frequency of the EM signal deviates from the frequency of the EM radiation by less than 1%, in particular less than 0.1%, more particular less than 0.01%. For instance, both the EM signal and the EM radiation are microwave signals. The EM radiation emitted by the DUT 101 can be superimposed by the EM signal within the medium.

Based on this superposition of EM radiation and EM signal within the medium, the phase of the EM radiation can be determined accurately. For example, the local oscillator 109 is locally displaced while emitting the EM signal, resulting in a shift of the relative phase between the EM signal and the EM radiation within the medium. This shift of the relative phase causes an observable change in the intensity profile. The processor can be configured to determine the phase of the EM radiation based on the observed change of the relative phase. Thereby, the processor can take further parameters into account, such as: the displacement of the emitter unit, the emission angle of the EM signal, the intensity of the EM signal, and/or a propagation constant of the medium.

By tuning the amplitude of the magnetic field and/or the frequency of the EM signal emitted by the local oscillator, the system can sweep through known emission frequencies of the DUT and measure a location of an emitter of the EM radiation and/or the phase of the EM radiation at said frequencies.

The resonant frequency of the medium 103 can further be tuned with a constant electric field instead of or in addition to the magnetic field. In particular, the resonance frequency of the medium 103 may also be influenced by an oscillation frequency of the electric and/or magnetic field.

The system 100 can further comprise a shielding 401, which is arranged between the DUT 101 and the medium 103. The shielding 401 can be configured to shield the DUT 101 from the magnetic field 203. For example, the shielding 401 is made of a Mu-metal.

In particular, the systems 100 shown in FIGS. 3 and 4 are quantum spectrum analyzer systems, which measure in a spatial domain.

FIGS. 5a and 5b show schematic diagrams of measurement schemes for localizing an EM radiation source on the DUT 101 according to embodiments. In particular, the measurements shown in FIGS. 5a and 5b were carried out by one of the systems 100 shown in FIG. 3 or FIG. 4.

FIG. 5a shows a measurement, where the system 100, in particular the image detector 107, is arranged directly above the source of the EM radiation 201 on the DUT 101. Thereby, the EM radiation 201 is assumed to be a periodic signal that is radially irradiated from a point in space. The corresponding intensity profile 303 shows the expected phase image for this configuration, which is, for instance, radially symmetric and centered in the intensity profile 303. In particular, the intensity profile corresponds to an intensity distribution.

FIG. 5b shows a measurement, where the sensor system, in particular the image detector 107, is laterally shifted to the source of the EM radiation 201 on the DUT 101. Again, the EM radiation 201 is assumed to be a periodic signal that is radially irradiated from a point in space. The corresponding intensity profile 303 shows the expected phase image for this configuration, which, for instance, shows a section of a radial phase distribution.

The processor of the system 100 can be configured to analyze the phase images and determine the location on the DUT 101 from which the EM radiation 201 was emitted based on the features in the image. The processor can further be configured to determine the phase of the EM radiation 201 based on the phase image.

Figure 6:
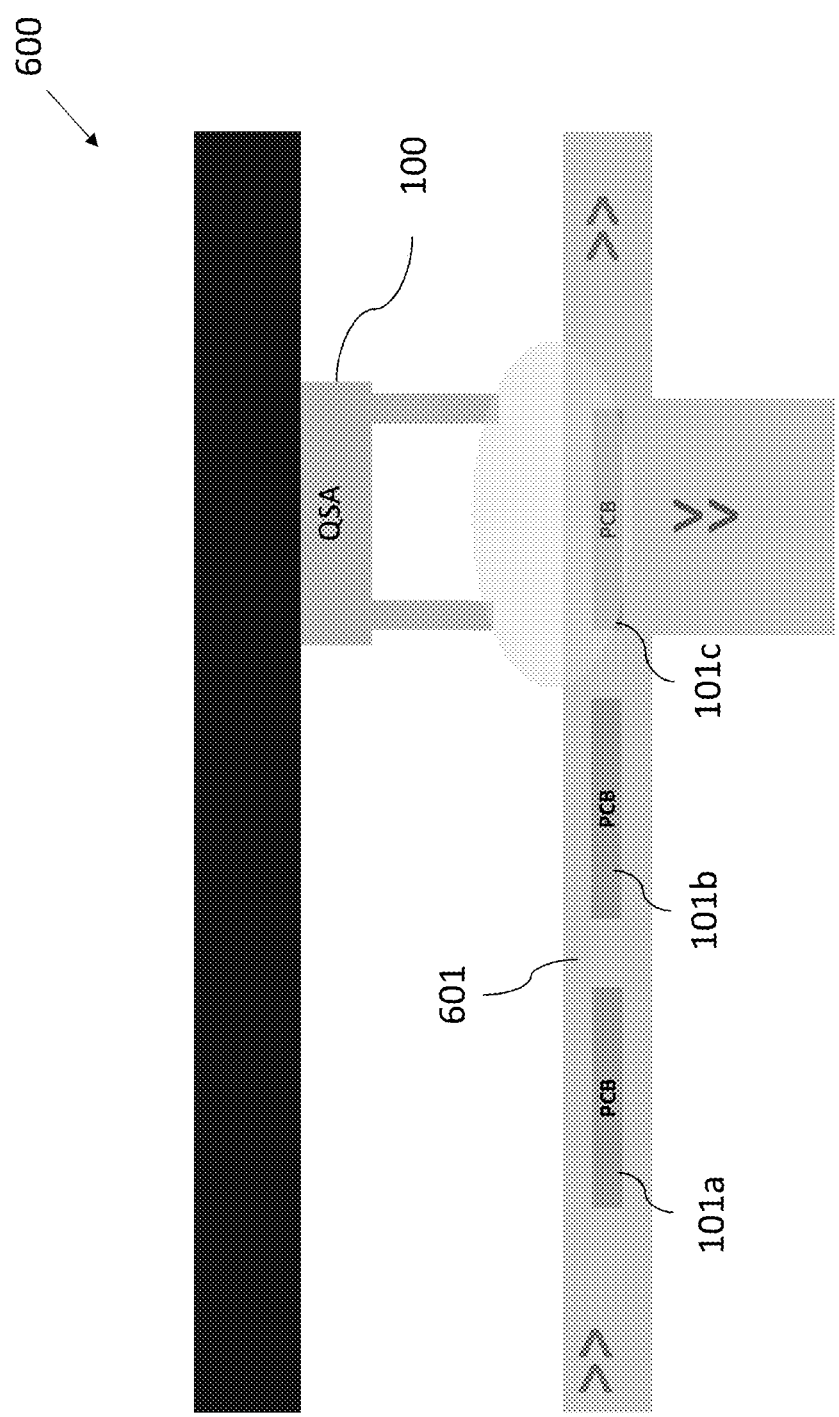
FIG. 6 shows a schematic diagram of an assembly line according to an embodiment.

FIG. 6 shows a schematic diagram of an assembly line 600 according to an embodiment.

The assembly line 600 comprises a system 100 for testing DUTs 101, for example any one of the systems 100 shown in FIGS. 1 to 5. The assembly line 600 can be an automated rapid assembly line for PCB screening, wherein each PCB 101a-c on the line is a DUT 101 that is tested by the system 100. In particular, the PCBs iota-c are post-assembly PCBs.

The assembly line 600 can comprise a conveyer band 601 for moving the PCBs 101a-c to guide the PCBs 101a-c past the system 100, wherein the system 100 can be configured to perform a contactless screening of each PCB 101a-c. Preferably, if a PCB 101a-c passes the screening it is moved forward, and if a PCB 101a-c fails the screening, it is moved into a secondary band for further testing. In this way, the PCBs 101a-c can be screening quickly during or after a production cycle.

Figure 7:
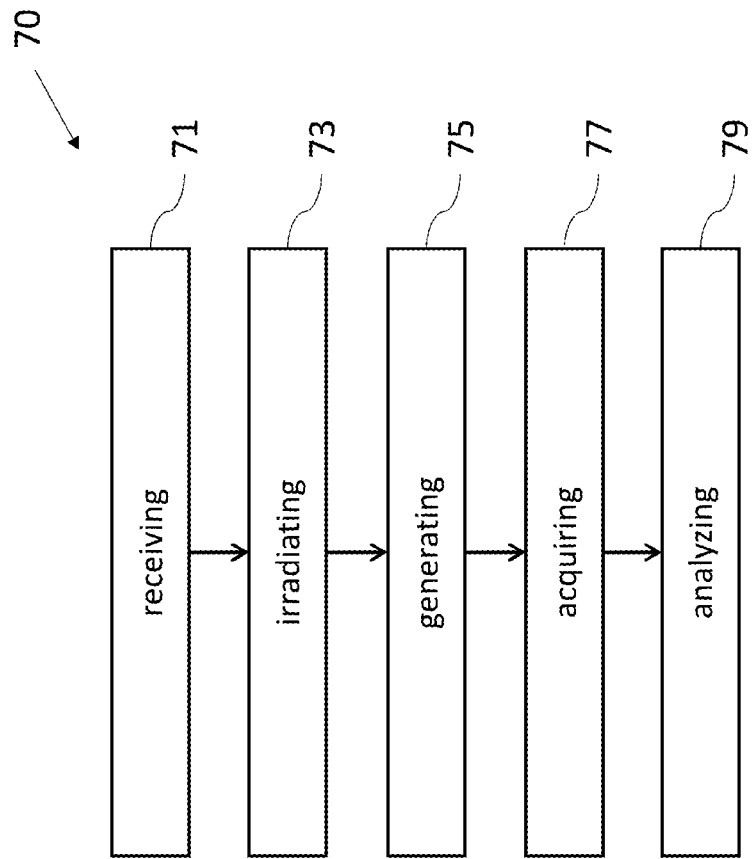
FIG. 7 shows a schematic diagram of a method for testing a DUT according to an embodiment.

FIG. 7 shows a schematic diagram of a method 70 for testing the DUT 101. In particular, the method 70 can be carried out by any one of the systems 100 shown in FIGS. 1 to 6.

The method 70 comprises:
receiving 71 the EM radiation 201 emitted by the DUT 101 at the optically excitable medium 103,
irradiating 73 the medium 103 with at least one light beam 105a, 105b; wherein the medium 103 is optically excited by the at least one light beam 105a, 105b,
generating 75 the electric and/or magnetic field within the medium 103, wherein the resonance frequency of the excited medium 103 is modified by the amplitude and/or the oscillation frequency of the electric and/or magnetic field,
wherein the optical parameter, in particular the luminescence, of the exited medium 103 is locally modified if a frequency of the EM radiation 201 corresponds to the resonance frequency at a position in the medium 103,
acquiring 77 an image of the medium 103, wherein the image shows an intensity profile 303 that results from the modification of the optical parameter, and
analyzing 79 the DUT 101 based on the acquired image.

Preferably, the step of analyzing 79 the DUT 101 comprises:
extracting and/or reconstructing a phase information of the EM radiation 201 from the intensity profile 303.
Preferably the method 70 further comprises:

emitting an EM signal towards the medium 103, wherein the EM radiation 201 emitted by the DUT 101 is superimposed by the EM signal within the medium 103; and wherein the phase information of the EM radiation 201 is extracted and/or reconstructed from a change in the intensity profile resulting from the superposition of the EM radiation 201 and the EM signal within the medium 103.

Preferably, the amplitude of the electric and/or magnetic field varies at different positions within the excited medium 103, resulting in a variation of the resonance frequency at said positions, wherein the step of analyzing 79 the DUT 101 further comprises:

determining the frequency of the EM radiation 201 based on a location and/or a shape of features in the intensity profile 303.

Preferably, the amplitude of the electric and/or magnetic field is homogeneous in the excited medium 103, resulting in an equal resonance frequency everywhere within the medium 103, wherein the step of analyzing 79 the DUT 101 further comprises:

determining a location of a source of the EM radiation 201 on the DUT 101 based on a location and/or a shape of features in the intensity profile 303.

The medium 103 can be irradiated with two light beams 105a, 105b, wherein of each of the two light beams 105a, 105b can have a frequency that corresponds to a different resonance frequency of the medium 103.

All features of all embodiments described, shown and/or claimed herein can be combined with each other.

The invention claimed is:

1. A system in particular a quantum sensor system, for testing a device-under-test, DUT, comprising:
    an optically excitable medium which is arranged to receive electromagnetic, EM, radiation emitted by the DUT,
    at least one light source configured to irradiate the medium with at least one light beam, wherein the medium is optically excited by the at least one light beam,
    a field generator unit configured to generate an electric and/or magnetic field within the medium, wherein a resonance frequency of the excited medium is modified by an amplitude of the electric and/or magnetic field,
    wherein an optical parameter, in particular a luminescence, of the exited medium is locally modified if a frequency of the EM radiation corresponds to the resonance frequency at a position in the medium,
    an image detector configured to acquire an image of the medium, wherein the image shows an intensity profile that results from the modification of the optical parameter, and
    a processor configured to analyze the DUT based on the acquired image.

2. The system according to claim 1, wherein the processor is configured to extract and/or reconstruct a phase information of the EM radiation from the intensity profile.

3. The system according to claim 2, further comprising an emitter unit, in particular a local oscillator, wherein the emitter unit is configured to emit an EM signal towards the medium, wherein the EM radiation emitted by the DUT is superimposed by the EM signal within the medium, and wherein the processor is configured to extract and/or reconstruct the phase information of the EM radiation from a change in the intensity profile resulting from the superposition of the EM radiation and the EM signal within the medium.

4. The system according to claim 1, wherein the amplitude of the electric and/or magnetic field varies at different positions in the excited medium, resulting in different resonance frequencies at said positions, wherein the processor is configured to determine the frequency of the EM radiation based on a location and/or a shape of features in the intensity profile.

5. The system according to claim 1, wherein the amplitude of the electric and/or magnetic field is homogeneous in the excited medium, resulting in an equal resonance frequency everywhere in the medium, wherein the processor is configured to determine a location of a source of the EM radiation on the DUT based on a location and/or a shape of features in the intensity profile.

6. The system according to claim 1, wherein the system comprises two light sources configured to irradiate the medium with two light beams, wherein of each of the two light beams has a frequency that corresponds to a different resonance frequency of the medium.

7. The system according to claim 1, wherein the field generator unit comprises a capacitor.

8. The system according to claim 1, wherein the optically excitable medium is a gas, in particular a caesium gas, wherein the gas is stored in a gas cell.

9. The system according to claim 1, wherein the optically excitable medium is a solid material, in particular diamond.

10. The system according to claim 1, wherein the DUT is a printed circuit board, PCB.

11. A method for testing a device-under-test, DUT, comprising the steps:
    receiving an electromagnetic, EM, radiation emitted by the DUT at an optically excitable medium,
    irradiating the medium with at least one light beam; wherein the medium is optically excited by the at least one light beam
    generating an electric and/or magnetic field within the medium, wherein a resonance frequency of the excited medium is modified by an amplitude of the electric and/or magnetic field,
    wherein an optical parameter, in particular a luminescence, of the exited medium is locally modified if a frequency of the EM radiation corresponds to the resonance frequency at a position in the medium,
    acquiring an image of the medium, wherein the image shows an intensity profile that results from the modification of the optical parameter, and
    analyzing the DUT based on the acquired image.

12. The method according to claim 11, wherein the step of analyzing the DUT comprises:
    extracting and/or reconstructing a phase information of the EM radiation from the intensity profile.

13. The method according to claim 12, wherein the method further comprises:
    emitting an EM signal towards the medium, wherein the EM radiation emitted by the DUT is superimposed by the EM signal within the medium; and
    wherein the phase information of the EM radiation is extracted and/or reconstructed from a change in the intensity profile resulting from the superposition of the EM radiation and the EM signal within the medium.

14. The method according to claim 11, wherein the amplitude of the electric and/or magnetic field varies at different positions in the excited medium, resulting in a variation of the resonance frequency at said positions, wherein the step of analyzing the DUT comprises:

determining the frequency of the EM radiation based on a location and/or a shape of features in the intensity profile.

15. The method according to claim 11, wherein the amplitude of the electric and/or magnetic field is homogeneous in the excited medium, resulting in an equal resonance frequency everywhere in the medium, wherein the step of analyzing the DUT comprises:
determining a location of a source of the EM radiation on the DUT based on a location and/or a shape of features in the intensity profile.

16. The method according to claim 11, wherein the medium is irradiated with two light beams, wherein of each of the two light beams has a frequency that corresponds to a different resonance frequency of the medium.

* * * * *